United States Patent
Zhou

(10) Patent No.: US 10,096,518 B2
(45) Date of Patent: Oct. 9, 2018

(54) SEMICONDUCTOR STRUCTURES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/665,651

(22) Filed: Aug. 1, 2017

(65) Prior Publication Data
US 2018/0047631 A1    Feb. 15, 2018

(30) Foreign Application Priority Data

Aug. 9, 2016   (CN) .......................... 2016 1 0646944

(51) Int. Cl.
*H01L 21/76*       (2006.01)
*H01L 21/8234*    (2006.01)
(Continued)

(52) U.S. Cl.
CPC ............... *H01L 21/823412* (2013.01); *H01L 21/02236* (2013.01); *H01L 21/76224* (2013.01);
(Continued)

(58) Field of Classification Search
CPC ..... H01L 21/823412; H01L 21/823431; H01L 27/0886; H01L 29/66818; H01L 29/1037;
(Continued)

(56) References Cited

U.S. PATENT DOCUMENTS

2009/0278196 A1 * 11/2009 Chang ............. H01L 21/823412
                                                                    257/328
2011/0151677 A1   6/2011 Wang et al.
(Continued)

FOREIGN PATENT DOCUMENTS

WO        2013095550 A1    6/2013

OTHER PUBLICATIONS

The European Patent Office (EPO) The Extended European Search Report for 17185248.6 dated Jan. 3, 2018 8 Pages.

*Primary Examiner* — Bitew Dinke
(74) *Attorney, Agent, or Firm* — Anova Law Group, PLLC

(57) ABSTRACT

Semiconductor structure and fabrication method thereof are provided. An exemplary method includes providing a semiconductor substrate including a plurality of first fin structures, each having a first width, and a plurality of second fin structures, each having a second width greater than the first width. The method further includes forming a first isolation film covering sidewall surfaces of the first fin structures and the second fin structures, forming a trench in the first isolation film to expose at least a top portion of at least one sidewall surface of one or more second fin structures, forming an isolation fluid layer to fill the trenches, and performing an oxygen annealing process to convert a surface layer of the top portion of the at least one sidewall surface of the one or more second fin structures into a by-product layer, and to convert the isolation fluid layer into a second isolation film.

17 Claims, 5 Drawing Sheets

(51) Int. Cl.
| | |
|---|---|
| *H01L 21/02* | (2006.01) |
| *H01L 21/762* | (2006.01) |
| *H01L 27/088* | (2006.01) |
| *H01L 29/06* | (2006.01) |
| *H01L 29/10* | (2006.01) |
| *H01L 29/66* | (2006.01) |
| *H01L 27/11* | (2006.01) |

(52) U.S. Cl.
CPC ............ *H01L 21/823431* (2013.01); *H01L 21/823481* (2013.01); *H01L 27/0886* (2013.01); *H01L 29/0653* (2013.01); *H01L 29/1037* (2013.01); *H01L 29/66818* (2013.01); *H01L 27/1104* (2013.01)

(58) Field of Classification Search
CPC ........... H01L 21/02236; H01L 29/0653; H01L 21/76224; H01L 27/1104; H01L 21/823878; H01L 29/7846; H01L 21/76; H01L 21/823481
See application file for complete search history.

(56) References Cited

U.S. PATENT DOCUMENTS

| | | | |
|---|---|---|---|
| 2013/0244392 A1 | 9/2013 | Oh et al. | |
| 2015/0064929 A1 | 3/2015 | Tseng et al. | |
| 2015/0171085 A1 | 6/2015 | Fumitake et al. | |
| 2015/0200276 A1* | 7/2015 | Cheng ............... | H01L 29/66818 257/401 |
| 2015/0262861 A1* | 9/2015 | Hung ................ | H01L 29/66795 438/439 |
| 2016/0225659 A1* | 8/2016 | Jacob ................ | H01L 21/76213 |
| 2016/0225677 A1* | 8/2016 | Jacob .................... | H01L 21/845 |
| 2016/0225771 A1* | 8/2016 | Wu .................. | H01L 21/823821 |
| 2017/0062591 A1* | 3/2017 | Zhou ................ | H01L 29/66795 |
| 2018/0047812 A1* | 2/2018 | Leobandung ..... | H01L 21/02381 |

* cited by examiner

SEMICONDUCTOR STRUCTURES AND FABRICATION METHODS THEREOF

CROSS-REFERENCES TO RELATED APPLICATIONS

This application claims the priority of Chinese Patent Application No. CN201610646944.5, filed on Aug. 9, 2016, the entire content of which is incorporated herein by reference.

FIELD OF THE DISCLOSURE

The present disclosure generally relates to the field of semiconductor fabrication technology and, more particularly, relates to semiconductor structures and fabrication methods thereof.

BACKGROUND

Metal-oxide-semiconductor (MOS) transistor is one of the most important components in modern integrated circuits (ICs). A basic structure of a MOS transistor includes a semiconductor substrate, a gate structure formed on the surface of the semiconductor substrate, and doped source/drain regions formed in the semiconductor substrate on the two sides of the gate structure. Usually, the gate structure includes a gate dielectric layer formed on the surface of the semiconductor substrate and a gate electrode layer formed on the surface of the gate dielectric layer.

With continuous development of semiconductor technology, traditional planar MOS transistor exhibits weak controllability on the channel current, causing severe leakage current issues. Fin field-effect-transistor (Fin-FET) is an emerging multi-gate device to overcome the problems seen in traditional planar MOS transistors. A Fin-FET usually includes a semiconductor substrate, a fin structure protruding from the surface of the semiconductor substrate, a gate structure covering a portion of the top and the sidewall surfaces of the fin structure, and source/drain doped regions formed in the fin structure on the two sides of the gate structure.

However, for semiconductor devices formed by existing Fin-FETs, the fin structures may still not have a uniform width and the lack of fin width consistency may further affect the performance of the semiconductor devices. The disclosed semiconductor structures and fabrication methods thereof are directed to solve one or more problems set forth above and other problems in the art.

BRIEF SUMMARY OF THE DISCLOSURE

One aspect of the present disclosure includes a method for fabricating a semiconductor structure. The method includes providing a semiconductor substrate including a plurality of first fin structures and a plurality of second fin structures. Each first fin structure has a first width and each second fin structure has a second width greater than the first width. The method also includes forming a first isolation film on the semiconductor substrate and covering sidewall surfaces of the first fin structures and the second fin structures, forming a trench in the first isolation film to expose at least a top portion of at least one sidewall surface of one or more second fin structures, and forming an isolation fluid layer to fill the trenches. Further, the method includes performing an oxygen annealing process to convert a surface layer of the top portion of the at least one sidewall surface of the one or more second fin structures into a by-product layer, and to convert the isolation fluid layer into a second isolation film.

Another aspect of the present disclosure provides a semiconductor structure. The semiconductor structure includes a semiconductor substrate including fin structures. The fin structures include a plurality of first fin structures and a plurality of second fin structures. Each first fin structure has a first width and each second fin structure has a second width at a lower potion and a third width at an upper portion. The second width is greater than each of the first width and the third width. The semiconductor structure also includes a first isolation film formed on the semiconductor substrate and between adjacent fin structures. The first isolation film has a top surface lower than the first fin structures, and the upper portion of each second fin structure has the third width extending into the top surface of the first isolation film.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

For semiconductor devices fabricated by existing methods, the fin structures may not have a uniform fin width.

Figure 1:
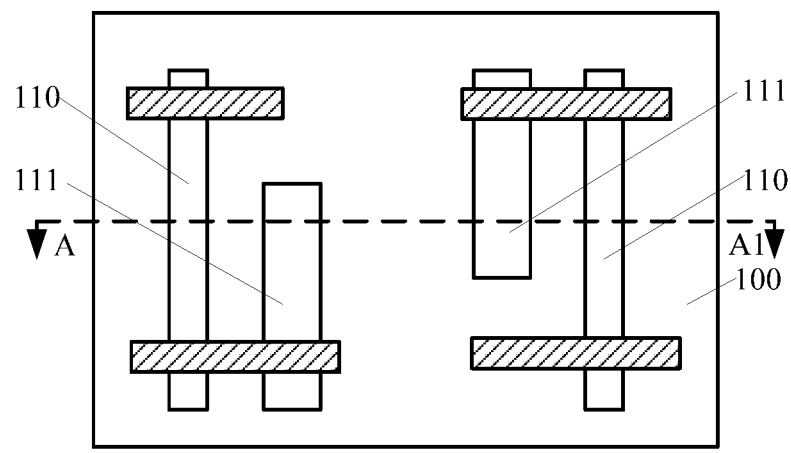
FIG. 1 illustrates a schematic cross-section view of a semiconductor structure.
Figure 2:
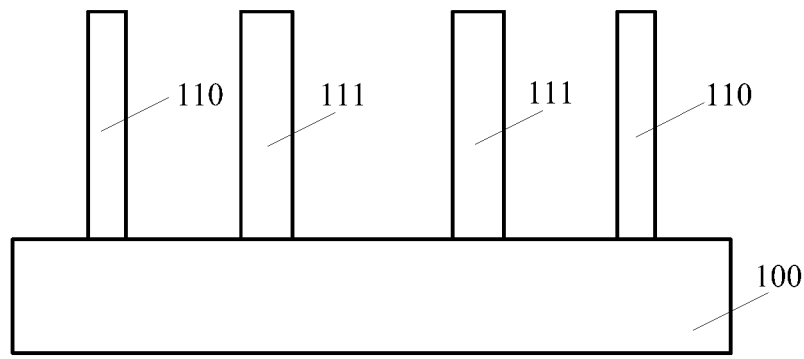
FIG. 2 illustrates a schematic cross-section view of the semiconductor structure shown in FIG. 1 along an A-A1 line.

FIG. 1 shows a schematic cross-section view of a semiconductor structure. FIG. 2 shows a schematic cross-section view of the semiconductor structure shown in FIG. 1 along an A-A1 line.

Referring to FIG. 1, the semiconductor device is a static random-access memory (SRAM) device. The semiconductor device includes a semiconductor substrate 100, two first fin structures 110 formed on the semiconductor substrate 100, and a fin structure group including two adjacent second fin structures 111 formed on the semiconductor substrate. The two first fin structures are situated on the two opposite sides of the fin structure group with each first fin structure 110 close to one second fin structure 111.

The two first fin structures 110 and the two second fin structures 111 are all directly formed from the semiconductor substrate 100 through an etching process. The distance between the two neighboring second fin structures 111 is in a range of approximately 30 nm to 100 nm.

For illustration purpose, a trench formed between a first fin structure 110 and a neighboring second fin structure 111 is denoted as a first trench while a trench between two neighboring second fin structures 111 is denoted as a second trench.

Based on technical design requirements, the distance between a first fin structure 110 and a neighboring second fin structure 111 is smaller than the distance between the two second fin structures 111. Therefore, during the process to pattern the semiconductor substrate, the portion of the semiconductor substrate 100 to be removed in order to form each first trench may be less than the portion of the semiconductor substrate 100 to be removed in order to form each second trench. Specifically, a smaller amount of the material of the semiconductor substrate 100 may need to be removed in order to form each first trench, and thus only a small amount of by-product materials may be formed. As compared, a larger amount of the material of the semiconductor substrate 100 may need to be removed in order to form each second trench. Accordingly, a larger amount of the by-product materials may be formed. That is, the by-product materials formed on the sidewalls of the first trench may be less than the by-product formed on the sidewalls of the second trench. Further, accumulation of the by-product materials may reduce the etch rate on the semiconductor substrate 100. Therefore, the etch rate on the sidewalls of the first trench may be larger than the etch rate on the sidewalls of the second trench, which may further lead to the width of the first fin structure 110 smaller than the width of the second fin structure 111. As such, the first fin structure 110 and the second fin structure 111 may not demonstrate desired fin width uniformity.

Figure 9:
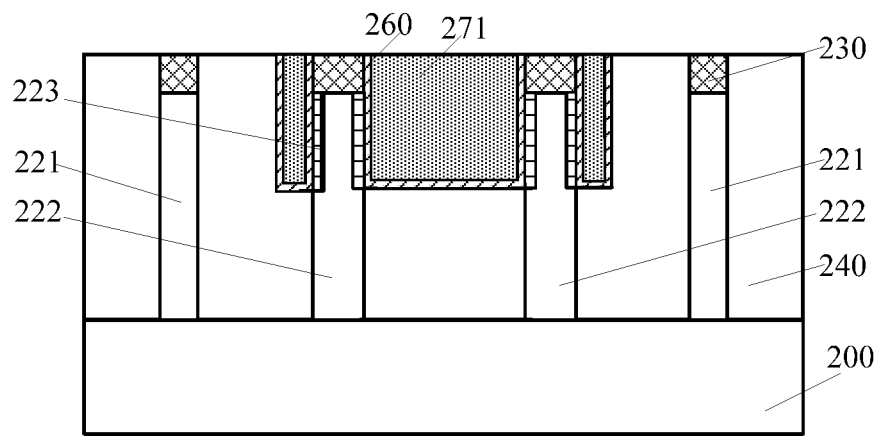
Figure 10:
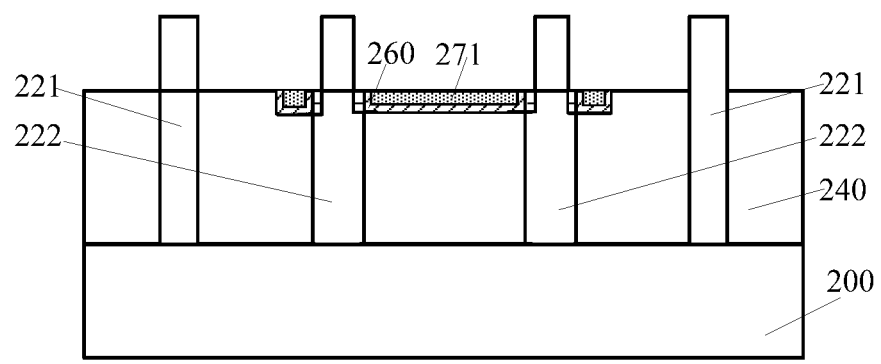
Figure 11:
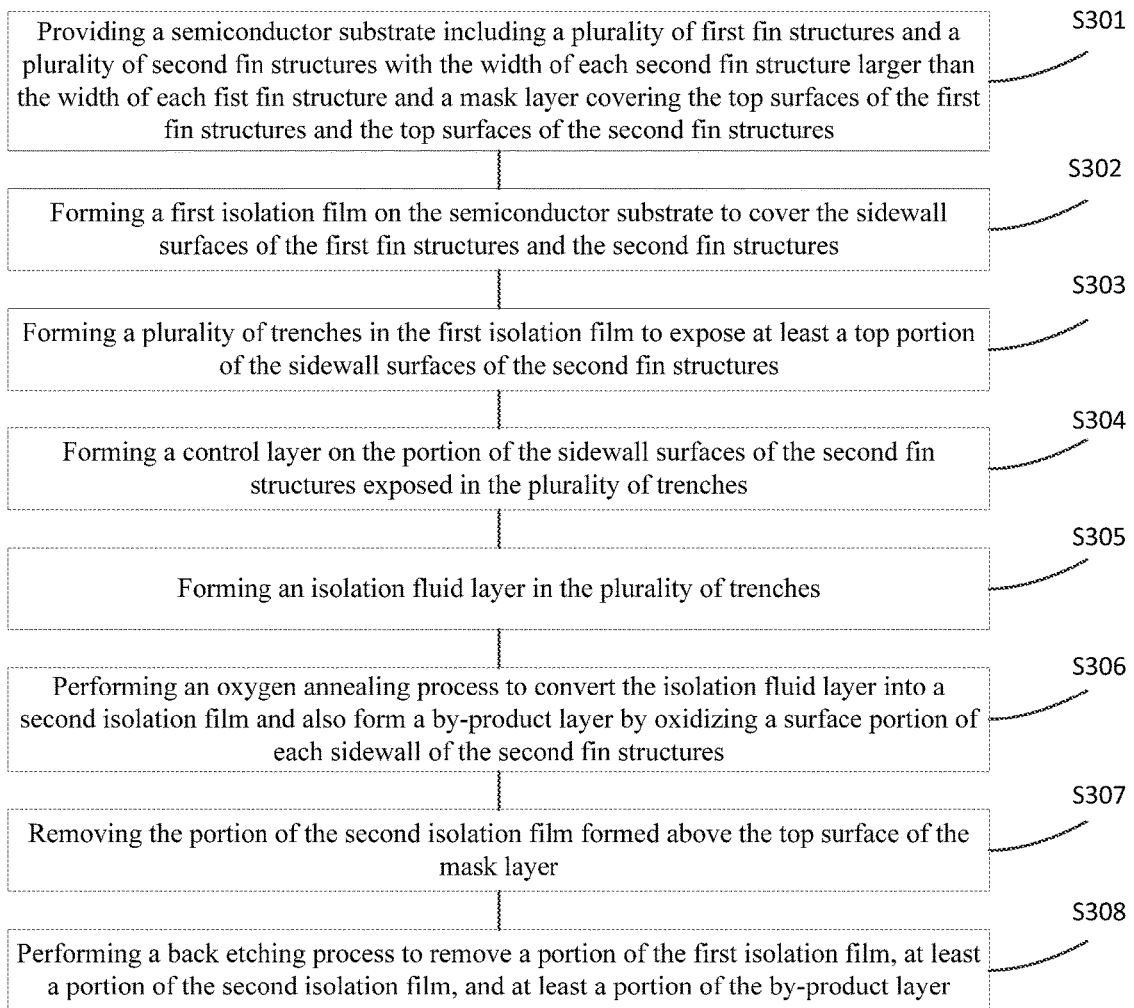
FIG. 11 illustrates a flowchart of an exemplary fabrication process for a semiconductor structure consistent with disclosed embodiments in the present disclosure.

The present disclosure provides a method for fabricating a semiconductor structure. FIG. 11 shows a flowchart of an exemplary fabrication method consistent with disclosed embodiments in the present disclosure. FIGS. 3-10 show schematic cross-section views of semiconductor structures at certain stages of the fabrication process.

Figure 3:
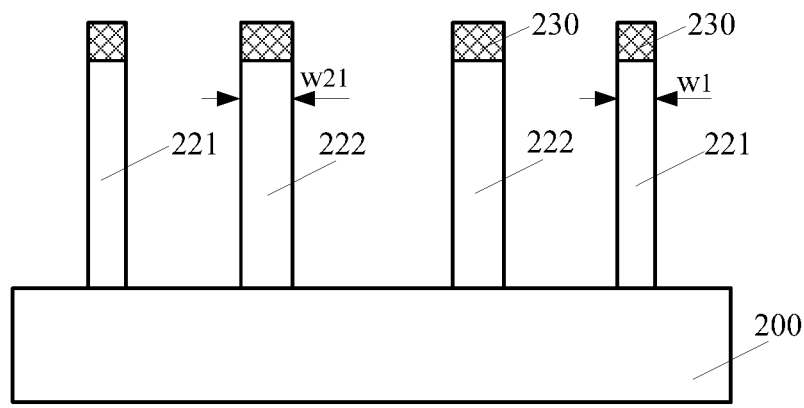
FIGS. 3-10 illustrate schematic cross-section views of semiconductor structures at certain stages of an exemplary fabrication process consistent with disclosed embodiments in the present disclosure.

Referring to FIG. 11, at the beginning of the fabrication process, a semiconductor substrate including a plurality of first fin structures and a plurality of second fin structures (S301). FIG. 3 shows a schematic cross-section view of a corresponding semiconductor structure.

Referring to FIG. 3, a semiconductor substrate 200 is provided. A plurality of first fin structures 221 and a plurality of second fin structures 222 may be formed on the semiconductor substrate 200. The fin width of each first fin structure 221 may be a first width W1 while the fin width of each second fin structure 222 may be a second width W21. The second width W21 may be larger than the first width W1.

The semiconductor substrate 200 may provide a technology platform for subsequent formation of a semiconductor device. The semiconductor substrate 200 may be made of single crystalline silicon, polycrystalline silicon, or amorphous silicon. The semiconductor substrate 200 may also be made of germanium, SiGe, GaAs, and any other appropriate semiconductor material. Moreover, the semiconductor substrate 200 may also be made of silicon on insulator (SOI) or germanium on insulator (GOI). In one embodiment, the semiconductor substrate 200 is made of single crystalline silicon.

The first width W1 may refer to the dimension of each first fin structure 221 along a direction perpendicular to a length direction of the first fin structure 221 and also parallel to the surface of the semiconductor substrate 200. Similarly, the second width W21 may refer to the dimension of each second fin structure 222 along a direction perpendicular to the length direction of the second fin structure 222 and also parallel to the surface of the semiconductor substrate 200.

In one embodiment, the first fin structures 221 and the second fin structures 222 may be formed from the semiconductor substrate 200 through an etching process. Specifically, to form the first fin structures 221 and the second fin structures 222, a mask layer 230 may be formed on the semiconductor substrate 200. The mask layer may define the positions of the first fin structures 221 as well as the positions of the second fin structures 222. Further, the first fin structures 221 and the second fin structures 222 may then be formed by removing a portion of the semiconductor substrate 200 through an etching process using the mask layer 230 as an etch mask.

In one embodiment, the mask layer 230 is made of $SiN_x$ or SiON. In other embodiments, the mask layer may be made of a photoresist material.

In one embodiment, after forming the first fin structures 221 and the second fin structures 222, the mask layer 230 may not be removed. In other embodiments, after forming the first fin structures and the second fin structures, the mask layer 230 may be removed.

Moreover, in some other embodiments, the first fin structures and the second fin structures may be formed by a process including the following steps. First, a fin structure material layer (not shown) may be formed on the semiconductor substrate. Then, the fin structure material layer may be patterned and etched to form the plurality of the first fin structures and the plurality of the second fin structures.

The plurality of first fin structures 221 and the plurality of second fin structures 222 may be made of silicon, germanium, or SiGe. Specifically, the plurality of first fin structures 221 and the plurality of second fin structures 222 may be made of single crystalline silicon, single crystalline germanium, or single crystalline silicon.

The number of the first fin structures 221 may be one or more than one; the number of the second fin structures 222 may also be one or more than one. For illustration purpose, the semiconductor structure shown in FIG. 3 only includes two first fin structures 221 and two second fin structures 222; however, any number of the first fin structures 221 and/or the number of the second fin structures 222, less than or more than two may be encompassed according to various embodiments of the present disclosure.

In one embodiment, two first fin structures 221 and two second fin structures 222 may together form a fin structure unit. In each fin structure unit, the two neighboring second fin structures 222 may form a fin group and the two first fin structures 221 may be situated on the two opposite sides of the fin group. For two neighboring fin structure units, a first fin structure 221 in one fin structure unit may be next to a first fin structure 221 in the other fin structure.

In other embodiments, the first fin structures and the second fin structures may be arranged in any other appropriate order.

Further, based on technical design requirements, the distance between a first fin structure 221 and a neighboring second fin structure 222 may be less than the distance between two neighboring second fin structures 222. For illustration purpose, a trench formed between a first fin structure 221 and a neighboring second fin structure 222 is denoted as a first trench while a trench formed between two neighboring second fin structures 222 is denoted as a second trench.

Accordingly, during the process to pattern the semiconductor substrate 200 to further form the plurality of first fin structures 221 and the plurality of second fin structures 222, a smaller amount of the material of the semiconductor substrate 200 may need to be removed in order to form each first trench, and thus only a small amount of by-product materials may be formed. In the meantime, a larger amount of the material of the semiconductor substrate 200 may need to be removed in order to form the second trench. Accordingly, a larger amount of the by-product materials may be formed. Specifically, the by-product materials formed on the sidewalls of the first trench may be less than the by-product materials formed on the sidewalls of the second trench, and the accumulation of the by-product materials may reduce the etch rate. Therefore, the etch rate on the sidewalls of the first trench may be larger than the etch rate on the sidewalls of the second trench, and thus may further lead to the first width W1 of the first fin structure 221 smaller than the second width W21 of the second fin structure 222. As such, the width of the first fin structure 221 and the width of the second fin structure 222 may not demonstrate desired consistency.

The distance between the two neighboring second fin structures 222 may be in a range of approximately 30 nm to 100 nm.

Figure 4:
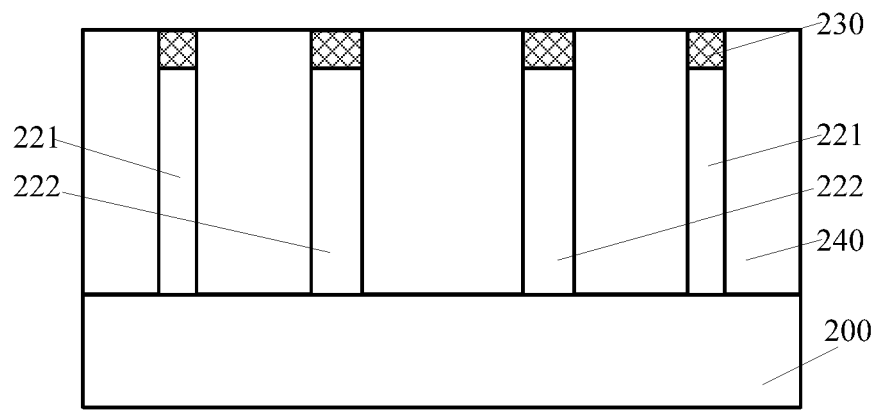

Further, returning to FIG. 11, a first isolation film may be formed on the semiconductor substrate to cover the sidewall surfaces of the first fin structures and the second fin structures (S302). FIG. 4 shows a schematic cross-section view of a corresponding semiconductor structure.

Referring to FIG. 4, a first isolation film 240 may be formed on the semiconductor substrate 200 to cover the sidewall surfaces of each first fin structure 221 as well as each second fin structure 222. The first isolation film 240 may be made of $SiO_x$, SiON, or SiCO.

In one embodiment, the process to form the first isolation film 240 may include the following steps. A first initial isolation film (not shown) may be formed to cover the first fin structures 221, the second fin structures 222, the mask layer 230, and the semiconductor substrate 200. Specifically, the top surface of the first initial isolation film may be above the top surface of the mask layer 230. Then, a portion of the first initial isolation film formed above the top surface of the mask layer 230 may be removed to form the first isolation film 240. Accordingly, the first isolation film 240 may also cover the sidewall surfaces of the mask layer 230.

The first initial isolation film may be formed by a deposition process, such as chemical vapor deposition (CVD), sub-atmosphere chemical vapor deposition (SA-CVD), high-density plasma chemical vapor deposition (HDP-CVD), low-pressure chemical vapor deposition (LP-CVD), etc. Specifically, using a fluid CVD process to form the first initial isolation film may result in desired filling effect of the first initial isolation film.

In other embodiments, the portion of the first initial isolation film formed above the top surface of the mask layer may be partially removed so that the first isolation film may cover the mask layer, the plurality of first fin structures, and the plurality of second fin structures.

Further, in the embodiments when the mask layer is not formed or the mask layer is removed prior to forming the first initial isolation film, the top surface of the formed first initial isolation film may be above the top surfaces of the first fin structures and the second fin structures. Accordingly, the portion of the first initial isolation film formed above the top surfaces of the first fin structures and the second fin structures may be removed to form the first isolation film.

In one embodiment, when the semiconductor structure does not include the mask layer, the first isolation film may cover the sidewall surfaces of the first fin structures and the second fin structures and leave the top surfaces of the first fin structures and the second fin structures uncovered. In other embodiments, when the semiconductor structure does not include the mask layer, the first isolation film may cover the top surfaces of the first fin structures and the second fin structures as well as the sidewall surfaces of the first fin structures and the second fin structures.

Figure 5:
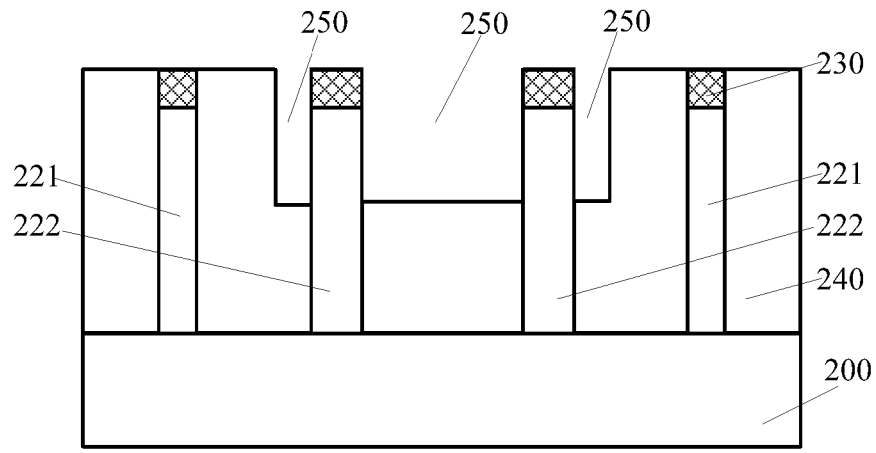

Further, returning to FIG. 11, a plurality of trenches may be formed in the first isolation film to expose at least a top portion of the sidewall surfaces of the second fin structures (S303). FIG. 5 shows a schematic cross-section view of a corresponding semiconductor structure.

Referring to FIG. 5, a plurality of trenches 250 may be formed in the first isolation film 240 to expose at least a top portion of the sidewall surfaces of the second fin structures 222. The trenches 250 may be formed by a dry etching process or a wet etching process.

In one embodiment, the plurality of trenches 250 may expose the sidewalls on both sides of the second fin structures 222. Specifically, the trenches 250 may expose a top portion of the sidewall surfaces on both sides of each second fin structure 222.

In other embodiments, the plurality of trenches may expose the entire sidewalls on both sides of each second fin structure 222. Moreover, in some other embodiments, the plurality of trenches may expose the sidewall on only one side of each second fin structure. Specifically, the trenches may expose a portion of the sidewall on only one side of each second fin structure; or alternatively, the trenches may expose the entire sidewall on only one side of each second fin structure.

When the trenches expose a portion of sidewalls on both sides of each second fin structure, or when the trenches expose a portion of the sidewall on only one side of each second fin structure, the trenches may not expose the surface of the semiconductor substrate. Accordingly, during the process to etch the first isolation film and form the trenches, the dimension of the portion of the first isolation film to be removed along the normal direction of the surface of the semiconductor substrate may be small. Therefore, the process efficiency may be improved and the production cost may also be reduced.

The portion of each sidewall surface of the second fin structures 222 exposed by the trenches 250 may be used as a width control surface.

Figure 6:
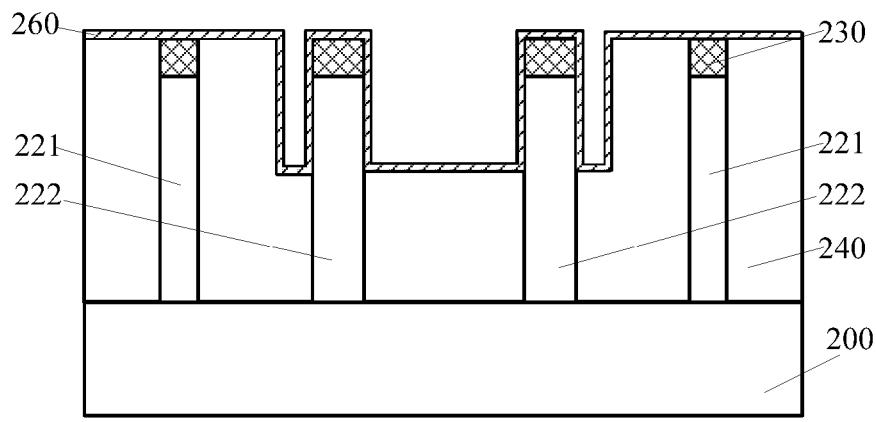

Further, returning to FIG. 11, a control layer may be formed on the portion of the sidewall surfaces of the second fin structures exposed in the trenches (S304). FIG. 6 shows a schematic cross-section view of a corresponding semiconductor structure.

Referring to FIG. 6, a control layer 260 may be formed on the portion of the sidewall surfaces of the second fin structures 222 exposed by the trenches 250 (referring to FIG. 5). The control layer 260 may be made of $SiO_x$, $SiN_x$, or SiON.

In one embodiment, the control layer 260 may be formed on the bottom and the sidewall surfaces of the plurality of trenches 250, on the mask layer 230, and also on the first isolation film 240. In other embodiments, when the first isolation film is formed to cover the mask layer, the control layer may be formed on the first isolation film as well as the bottom and the sidewall surfaces of the trenches.

When the semiconductor structure does not include the mask layer while the first isolation film does not cover the top surfaces of the first fin structures and the second fin structures, the control layer may be formed on the bottom and the sidewall surfaces of the plurality of trenches, the surfaces of the first fin structures and the second fin structures, and the surface of the first isolation film.

When the semiconductor structure does not include the mask layer while the first isolation film is formed to cover the top surfaces of the first fin structures and the second fin structures, the control layer may be formed on the bottom and the sidewall surfaces of the plurality of trenches as well as the surface of the first isolation film.

The control layer may be formed by a deposition process, including plasma chemical vapor deposition (PCVD), LP-CVD, atomic layer deposition (ALD), SA-CVD, etc.

In other embodiments, the control layer may be formed only on the portion of the sidewall surfaces of the second fin structures exposed by the trenches. In one embodiment, the control layer may be made of $SiO_x$ and the fabrication process may be a thermal oxidation process.

In a subsequent process, an isolation fluid layer may be formed in the trenches 250, and an oxygen annealing process may then be performed on the isolation fluid layer. Because of the presence of the control layer 260 between the isolation fluid layer and each second fin structure 222, the isolation fluid layer may not be directly in contact with the second fin structure 222. Therefore, the formation of the control layer 260 may reduce the oxidation rate of the second fin structure 222 during the subsequent oxygen annealing process. Specifically, the width of the portion of the second fin structure 222 corresponding to the width control surface may become a third width after the oxygen annealing process. Moreover, because of the reduction of the oxidation rate of the second fin structures 222 due to the presence of the control layer 260 during the oxygen annealing process, the disclosed fabrication method may be conducive to precise control of the third width.

The dimension of the control layer 260 along the direction perpendicular to the sidewall of the second fin structure 222 may need to meet certain requirements. Specifically, when the dimension of the control layer 260 along the direction perpendicular to the sidewall of the second fin structure is too small, the control of the oxidation rate of the second fin structure may be degraded. However, when the dimension of the control layer 260 along the direction perpendicular to the sidewall of the second fin structure is too large, during the subsequent oxygen annealing process, the oxidation rate of the second fin structure 222 may be significantly reduced. Therefore, a much longer time may be required in order to let the thickness of the portion of the second fin structure 222 corresponding to the width control surface reach the third width. As such, the efficiency of the oxygen annealing process may be reduced. In one embodiment, the dimension of the control layer 260 along the direction perpendicular to the sidewall surfaces of the second fin structures 222 may be in a range of 5 Å to 50 Å.

In other embodiments, the control layer may not be formed and in a subsequent process, an isolation fluid layer may be directly formed on the semiconductor structure. That is, the isolation fluid layer may be formed on the sidewall and the bottom surfaces of the trenches, and also on the first isolation film as well as the mask layer formed on the top surfaces of the first fin structures and the second fin structures.

Figure 7:
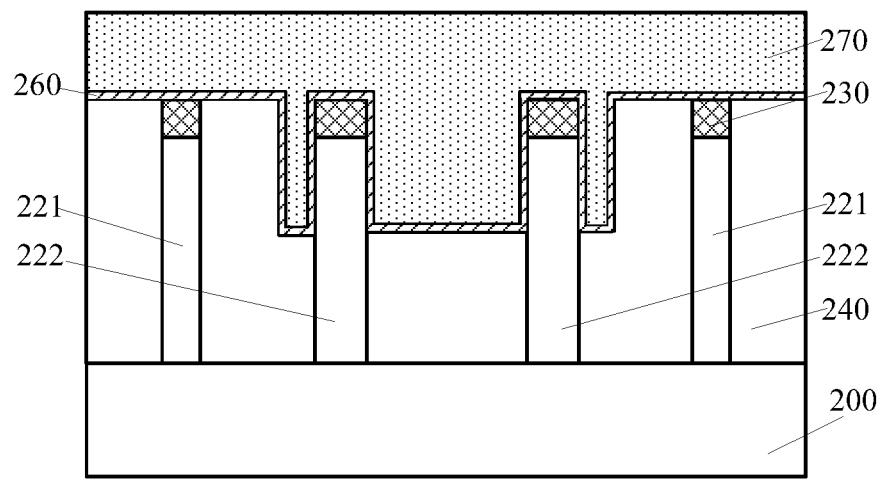

Further, returning to FIG. 11, an isolation fluid layer may be formed in the plurality of trenches (S305). FIG. 7 shows a schematic cross-section view of a corresponding semiconductor structure. Specifically, the structure shown in FIG. 7 is developed from the semiconductor structure shown in FIG. 6.

Referring to FIG. 7, an isolation fluid layer 270 may be formed in the plurality of trenches 250 (referring to FIGS. 5-6). In one embodiment, the isolation fluid layer 270 may be formed not only in the trenches 250, but also on the first fin structures 221, the second fin structures 222, and the first isolation film 240. Further, in the existence of the mask layer 230, the isolation fluid layer 270 may also cover the mask layer 230.

In one embodiment, because a control layer 260 is formed, the isolation fluid layer 270 may also cover the control layer 260.

The isolation fluid layer 270 may contain a large quantity of hydrogen atoms and may be in a fluid phase. The process parameters adopted to form the isolation fluid layer 270 may include a process gas including $NH_3$ and $(SiH_3)_3N$, a flow rate of $NH_3$ in a range of approximately 1 sccm to 1000 sccm, a flow rate of $(SiH_3)_3N$ in a range of approximately 3 sccm to 800 sccm, and a process temperature in a range of approximately 50° C. to 100° C.

Figure 8:
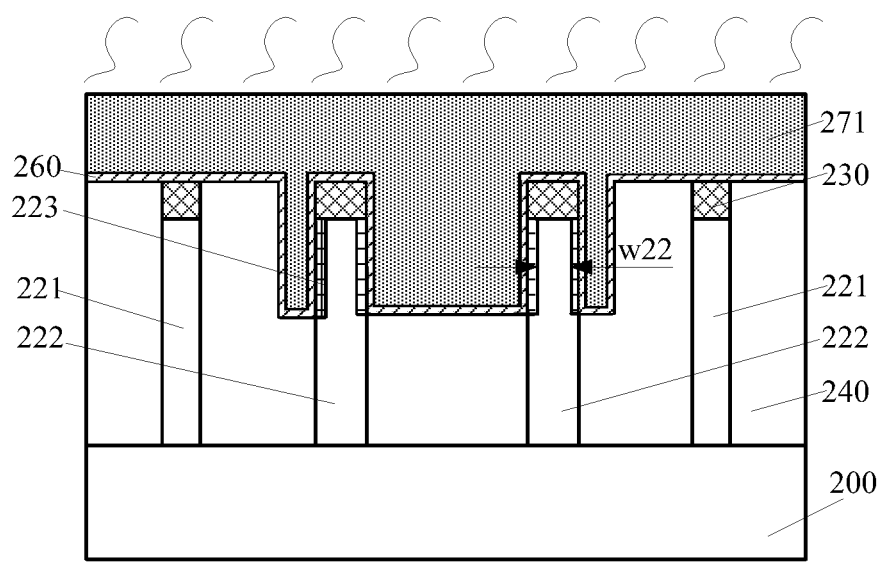

Further, returning to FIG. 11, after forming the isolation fluid layer, an oxygen annealing process may be performed to convert the isolation fluid layer into a second isolation film (S306). FIG. 8 shows a schematic diagram of an exemplary oxygen annealing process.

Referring to FIG. 8, after forming the isolation fluid layer 270 (referring to FIG. 7), an oxygen annealing process may be performed. Specifically, the oxygen annealing process may reduce the hydrogen concentration in the isolation fluid layer 270, and in the meantime, may also oxidize a surface portion of the sidewalls of the second fin structures 222. After the oxygen annealing process, a second isolation film 271 may be formed from the isolation fluid layer 270 (referring to FIG. 7).

In one embodiment, the oxygen annealing process may be a water vapor annealing and the second isolation film 271 may be made of $SiO_x$. The parameters adopted in the water vapor annealing process may include a process gas including oxygen, ozone, and water vapor, and an annealing temperature in a range of approximately 350° C. to 750° C.

During the water vapor annealing process, oxygen gas, ozone gas, and water vapor may be used respectively to treat the isolation fluid layer 270 at a temperature approximately between 350° C. and 750° C. The oxygen atoms in oxygen gas, ozone gas, and water vapor may partially or entirely replace the hydrogen atoms in the isolation fluid layer 270 so that the hydrogen concentration in the isolation fluid layer may be reduced. Moreover, at a temperature between 350° C. and 750° C., the isolation fluid layer 270 may be changed from the fluid state to a solid phase, and thus form the second isolation film 271.

In addition, the water vapor annealing process may also oxidize a surface portion of the sidewalls of the second fin structures 222. The region corresponding to the oxidized portion of the second fin structures 222 may form a by-product layer 223. In one embodiment, the by-product layer 223 is an oxidized layer.

During the water vapor annealing process, the oxygen atoms in oxygen gas, ozone gas, and water vapor may diffuse into the surfaces of the second fin structures 222 through the control layer. The oxygen atoms diffused into the surfaces of the second fin structures 222 may oxidize the sidewall surfaces of the second fin structures, and thus the width of the portion of each second fin structure 222 corresponding to the width control surface may be reduced.

The fluid CVD may also include a densification annealing process performed on the second isolation film 271 after the completion of the water vapor annealing process.

The parameters adopted in the densification annealing process may include a process gas including nitrogen, an annealing temperature in a range of approximately 850° C. to 1050° C.

The densification annealing process may improve the density of the internal structures of the second isolation film 271 and further reduce the concentration of hydrogen atoms in the second isolation film 271.

In one embodiment, after the water vapor annealing process, the width of the portion of each second fin structure 222 corresponding to the width control surface may be a third width W22. The third width W22 is smaller than the second width W21.

Because the third width W22 is smaller than the second width W21, the difference between the third width W22 and the first width W1 of the first fin structures 221 may be smaller than the difference between the second width W21 and the first width W1 of the first fin structures 221. Therefore, the uniformity of the width of the first fin structures 221 and the second fin structures 222 may be improved. In certain embodiments, the third width W22 may be substantially the same as the first width W1 of the first fin structures 221.

Further, returning to FIG. 11, the portion of the second isolation film formed above the top surface of the mask layer may be removed (S307). FIG. 9 shows a schematic cross-section view of a corresponding semiconductor structure.

Referring to FIG. 9, the portion of the second isolation film 271 formed above the top surface of the mask layer 230 may be removed.

Specifically, when the mask layer is not formed or is removed prior to forming the second isolation film 271, only the portion of the second isolation film 271 formed above the top surfaces of the first fin structures 221 and the second fin structures 222 may be removed. Moreover, when the mask layer is not formed, but a first isolation film is formed to cover the top surfaces of the first fin structures 221 and the second fin structures 222, the portion of the second isolation film as well as the first isolation film formed above the top surfaces of the first fin structures 221 and the second fin structures 222 may be removed. In addition, when the first isolation film is formed to cover the mask layer, removing the portion of the second isolation film as well as the first isolation film formed above the top surface of the mask layer may be required.

Further, returning to FIG. 11, a back etching process may be performed to remove a portion of the first isolation film, at least a portion of the second isolation film, and at least a portion of the by-product layer (S308). FIG. 10 shows a schematic cross-section view of a corresponding semiconductor structure.

Referring to FIG. 10, a back etching process may be performed to etch the first isolation film 240, the second isolation film 271, and the by-product layer 223 (referring to FIG. 9). After the back etching process, the surfaces of the first isolation film 240, the second isolation film 271, and the by-product layer may be lower than the top surfaces of the first fin structures 221 and the second fin structures 222.

In other embodiments, after performing the back etching process on the first isolation film, the second isolation film, and the by-product layer, the top surfaces of the first isolation film and the by-product layer may become lower than the top surfaces of the first fin structures and the second fin structures while the second isolation film may be completely removed to further form the isolation structure. Alternatively, after performing the back etching process on the first isolation film, the second isolation film, and the by-product layer, the top surface of the first isolation film may become lower than the top surfaces of the first fin structures and the second fin structures while the second isolation film and the by-product layer may be completely removed to further form the isolation structure.

When a control layer is formed in the semiconductor structure, during the back etching process performed on the first isolation film, the second isolation film, and the by-product layer, the back etching process may also etch the control layer such that the top surface of the control layer may also become lower than the top surfaces of the first fin structures and the second fin structures.

In one embodiment, during the back etching process to etch the first isolation film 240 and the second isolation film 271, the mask layer 230 (referring to FIG. 9) may also be removed.

The present disclosure also provides a semiconductor structure. FIG. 10 shows a schematic cross-section view of an exemplary semiconductor structure consistent with disclosed embodiments of the present disclosure.

Referring to FIG. 10, the semiconductor structure may include a semiconductor substrate 200, a plurality of first fin structures 221 and a plurality of second fin structures 222 formed on the semiconductor substrate, a first isolation film 240 formed on the semiconductor substrate with a top surface lower than the top surfaces of the first fin structures 221 and the second fin structures 222.

The semiconductor substrate 200 may be made of single crystalline silicon, polycrystalline silicon, or amorphous silicon. The semiconductor substrate 200 may also be made of germanium, SiGe, GaAs, and any other appropriate semiconductor material. Moreover, the semiconductor substrate 200 may also be made of silicon on insulator (SOI) or germanium on insulator (GOI). In one embodiment, the semiconductor substrate 200 is made of single crystalline silicon.

The plurality of first fin structures 221 and the plurality of second fin structures 222 may be made of silicon, germanium, or SiGe. In one embodiment, the first fin structures 221 and the second fin structures 222 may be formed from the semiconductor substrate 200 through an etching process.

The number of the first fin structures 221 may be one or more than one; the number of the second fin structures 222 may also be one or more than one. For illustration purpose, the semiconductor structure shown in FIG. 10 only includes two first fin structures 221 and two second fin structures 222. However, any number of the first fin structures 221 and/or the number of the second fin structures 222 less than or more than two may be encompassed according to various embodiments of the present disclosure.

In one embodiment, two first fin structures 221 and two second fin structure may together form a fin structure unit. In each fin structure unit, the two neighboring second fin structures 222 may form a fin group and the two first fin structures 221 may be situated separately on the two opposite sides of the fin group. For two neighboring fin structure units, a first fin structure 221 in one fin structure unit may be next to a first fin structure 221 in another fin structure. The distance between the two neighboring second fin structures 222 may be in a range of 30 nm to 100 nm.

In other embodiments, the first fin structures and the second fin structures may be arranged in any other appropriate order.

Further, the top width of each second fin structure 222 may be smaller than the bottom width of the second fin structure 222. Specifically, during the fabrication process, the top portion of the second fin structure 222 may have an initial width identical to the width of the bottom portion of the second fin structure 222; the initial width of the top portion of each second fin structure 222 may be reduced by an oxygen annealing process because a surface portion of each sidewall of the second fin structure may be oxidized during the oxygen annealing process. Moreover, the initial width of each second fin structure 222 may be larger than the width of each first fin structure 221. Because after the oxygen annealing process, the top width of each second fin structure 222 becomes smaller, the difference between the top width of the second fin structure 222 and the width of the first fin structure 221 may be smaller than the difference between the initial width of the second fin structure 222 and the width of the first fin structure 22. Therefore, the uniformity of the width of the first fin structures 221 and the second fin structures 222 may be improved.

In one embodiment, prior to performing the oxygen annealing process, a plurality of trenches 250 (referring to FIG. 5) may be formed to expose at least a top portion of each second fin structure 222, and a control layer 260 (referring to FIG. 6) and an isolation fluid layer 270 (referring to FIG. 7) may then be formed in the plurality of trenches 250.

The control layer 260 may be made of $SiO_x$, $SiN_x$, or SiON, and may be formed by a deposition process, including plasma chemical vapor deposition (PCVD), LP-CVD, atomic layer deposition (ALD), SA-CVD, etc.

The dimension of the control layer 260 along the direction perpendicular to the sidewall of the second fin structure 222 may need to meet certain requirements. Specifically, when the dimension of the control layer 260 along the direction perpendicular to the sidewall of the second fin structure is too small, the control of the oxidation rate of the second fin structure may be degraded. However, when the dimension of the control layer 260 along the direction perpendicular to the sidewall of the second fin structure is too large, during the subsequent oxygen annealing process, the oxidation rate of the second fin structure 222 may be significantly reduced. Therefore, a much longer time may be required in order to let the thickness of the portion of the second fin structure 222 corresponding to the width control surface reach the third width, and thus the efficiency of the oxygen annealing process may be reduced. In one embodiment, the dimension of the control layer 260 along the direction perpendicular to the sidewall surfaces of the second fin structures 222 may be in a range of 5 Å to 50 Å.

The isolation fluid layer 270 may contain a large quantity of hydrogen atoms and may be in a fluid phase.

The oxygen annealing process may reduce the hydrogen concentration in the isolation fluid layer 270, and in the meantime, may also oxidize a surface portion of the sidewalls of the second fin structures 222. After the oxygen annealing process, a second isolation film 271 may be formed from the isolation fluid layer 270 (referring to FIG. 7).

The isolation fluid layer 270 may contain a large quantity of hydrogen atoms and may be in a fluid phase. The process parameters used to form the isolation fluid layer 270 may include a process gas including $NH_3$ and $(SiH_3)_3N$, a flow rate of $NH_3$ in a range of approximately 1 sccm to 1000 sccm, a flow rate of $(SiH_3)_3N$ in a range of approximately 3 sccm to 800 sccm, and a process temperature in a range of approximately 50° C. to 100° C.

After forming the isolation fluid layer 270, the oxygen annealing process may be performed to convert the isolation fluid layer 270 into a second isolation film 271 (referring to FIG. 8).

Specifically, the oxygen annealing process may reduce the hydrogen concentration in the isolation fluid layer 270, and in the meantime, may also oxidize a surface portion of the sidewalls of the second fin structures 222. After the oxygen annealing process, a second isolation film 271 may be formed from the isolation fluid layer 270 (referring to FIG. 7).

In one embodiment, the oxygen annealing process may be a water vapor annealing and the second isolation film 271 may be made of $SiO_x$. The parameters adopted in the water vapor annealing process may include a process gas including oxygen, ozone, and water vapor, and an annealing temperature in a range of approximately 350° C. to 750° C.

During the water vapor annealing process, oxygen gas, ozone gas, and water vapor may be used respectively to treat the isolation fluid layer 270 at a temperature between 350° C. and 750° C. The oxygen atoms in oxygen gas, ozone gas, and water vapor may partially or entirely replace the hydrogen atoms in the isolation fluid layer 270 so that the hydrogen concentration in the isolation fluid layer may be reduced. Moreover, at a temperature approximately between 350° C. and 750° C., the isolation fluid layer 270 may be changed from the fluid state to a solid phase, and thus form the second isolation film 271.

In addition, the water vapor annealing process may also oxidize a surface portion of the sidewalls of the second fin structures 222. A by-product layer 223 (referring to FIG. 8) may be formed in the region corresponding to the oxidized portion of the second fin structures 222.

During the water vapor annealing process, the oxygen atoms in oxygen gas, ozone gas, and water vapor may diffuse into the surfaces of the second fin structures 222 through the control layer. The oxygen atoms diffused into the surfaces of the second fin structures 222 may oxidize the sidewall surfaces of the second fin structures, and thus the width of the portion of each second fin structure 222 corresponding to the width control surface, i.e. the top width of each second fin structure 222, may be reduced.

Finally, referring to FIG. 10, the top surface of the first isolation film 240 in the semiconductor structure may be defined by a back etching process after performing the oxygen annealing process.

Compared to existing fabrication methods and semiconductor structures, the disclosed fabrication methods and semiconductor structures may demonstrate several advantages.

For example, according to the disclosed fabrication methods, by performing an oxygen annealing process during a fluid CVD process to form the second isolation film, the second fin structure may be treated by the oxygen annealing process. Specifically, during the oxygen annealing process, the surface portion of the sidewalls of each second fin structure may be oxidized so that the width of the portion of the second fin structure exposed in the trenches may be reduced due to water vapor treatment. Therefore, the difference between the width of the portion of the second fin structure exposed in the trenches and the width of each first fin structure, i.e. the first width, may be smaller than the difference between the initial width of each second fin structure and the width of each first fin structure. Therefore, the uniformity of the width of the first fin structures, i.e. the first width, and the second fin structures, i.e. the second width, may be improved. Moreover, no additional oxygen treatment process may be required, and thus the fabrication process may be simplified.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
   providing a semiconductor substrate including a plurality of first fin structures, each having a first width, and a plurality of second fin structures, each having a second width greater than the first width;
   forming a first isolation film on the semiconductor substrate and covering sidewall surfaces of the first fin structures and the second fin structures;
   forming a trench in the first isolation film to expose at least a top portion of at least one sidewall surface of one or more second fin structures;
   forming an isolation fluid layer to fill the trenches;
   performing an oxygen annealing process to convert a surface layer of the top portion of the at least one sidewall surface of the one or more second fin structures into a by-product layer, and to convert the isolation fluid layer into a second isolation film.

2. The method for fabricating the semiconductor structure according to claim 1, wherein the isolation fluid layer is formed by a fluid chemical vapor deposition.

3. The method for fabricating the semiconductor structure according to claim 1, wherein the oxygen annealing process includes a water vapor annealing process.

4. The method for fabricating the semiconductor structure according to claim 3, wherein the oxygen annealing process includes:
   a process gas including oxygen, ozone, and water vapor; and
   an annealing temperature in a range of approximately 350° C. and 750° C.

5. The method for fabricating the semiconductor structure according to claim 3, further including:
   performing a densification annealing process on the second isolation film after the water vapor annealing process.

6. The method for fabricating the semiconductor structure according to claim 5, wherein the densification annealing process includes:
   a process gas including nitrogen gas; and
   an annealing temperature in a range of approximately 850° C. to 1050° C.

7. The method for fabricating the semiconductor structure according to claim 1, further including:
   forming a control layer on the exposed top portion of the at least one sidewall surface of the one or more second fin structures in the trenches, prior to forming the isolation fluid layer.

8. The method for fabricating the semiconductor structure according to claim 7, wherein a thickness of the control layer along a direction perpendicular to the sidewall surfaces of the second fin structures is in a range of approximately 5 Å to 50 Å.

9. The method for fabricating the semiconductor structure according to claim 7, wherein the control layer is made of $SiO_x$, $SiN_x$, or SiON.

10. The method for fabricating the semiconductor structure according to claim 1, wherein:
    the first fin structures and the second fin structures are made of Si, Ge, or SiGe; and
    the second isolation film is made of $SiO_x$.

11. The method for fabricating the semiconductor structure according to claim 1, wherein:
    the trench exposes an entire sidewall surface of one sidewall surface of each of the one or more second fin structures; or exposes entire sidewall surfaces of two sidewall surfaces of each of the one or more second fin structures.

12. The method for fabricating the semiconductor structure according to claim 1, further including:
    forming a mask layer on top surfaces of the first fin structures and the second fin structures, wherein:
    the first isolation film also covers sidewall surfaces of the mask layer.

13. The method for fabricating the semiconductor structure according to claim 1, wherein the first isolation film covers sidewall surfaces of the first fin structures and the second fin structures and exposes top surfaces of the first fin structures and the second fin structures, prior to forming the trench.

14. The method for fabricating the semiconductor structure according to claim 13, wherein:
    the second isolation film is formed on the first fin structures, the second fin structures, and the first isolation film; and
    a portion of the second isolation film above the top surfaces of the first fin structures and the second fin structures is further removed.

15. The method for fabricating the semiconductor structure according to claim 1, wherein the first isolation film covers sidewall and top surfaces of the first fin structures and the second fin structures.

16. The method for fabricating the semiconductor structure according to claim 15, wherein:
    the second isolation film is also formed on the first isolation film; and
    a portion of the second isolation film and a portion of the first isolation film that are above the top surfaces of the first fin structures and the second fin structures are removed.

17. The method for fabricating the semiconductor structure according to claim 1, further including:
    back etching the first isolation film, the second isolation film, and the by-product layer, wherein
    the first isolation film has a top surface lower than the top surfaces of the first fin structures and the second fin structures, one or more of the second isolation film and the by-product layer are either removed or have a top surface lower than the top surfaces of the first fin structures and the second fin structures.

* * * * *